United States Patent [19]

Burr et al.

[11] 4,053,925

[45] Oct. 11, 1977

[54] METHOD AND STRUCTURE FOR CONTROLLNG CARRIER LIFETIME IN SEMICONDUCTOR DEVICES

[75] Inventors: Peter Burr, Winchester, England; Richard C. Joy, Hopewell Junction; James F. Ziegler, Putnam Valley, both of N.Y.

[73] Assignee: IBM Corporation, Armonk, N.Y.

[21] Appl. No.: 602,710

[22] Filed: Aug. 7, 1975

[51] Int. Cl.² .................. H01L 21/76; H01L 21/265; H01L 29/167; H01L 29/32
[52] U.S. Cl. ........................................ 357/64; 357/29; 357/42; 357/48; 357/91; 148/1.5
[58] Field of Search ................. 357/29, 42, 48, 64, 357/91

[56] References Cited

U.S. PATENT DOCUMENTS

| 3,502,515 | 3/1970 | McMullen et al. | 357/64 |
| 3,645,808 | 2/1972 | Kamiyama et al. | 357/64 |
| 3,796,929 | 3/1974 | Nicholas et al. | 357/22 |
| 3,888,701 | 6/1975 | Tarneja et al. | 357/91 |

OTHER PUBLICATIONS

Dennehy, "Non-Latching Integrated Circuits", RCA Tech. Note No. 876, Feb. 1971.

*Primary Examiner*—William D. Larkins
*Attorney, Agent, or Firm*—Wolmar J. Stoffel

[57] ABSTRACT

The device structure is a bi-polar transistor having a region of inert atoms located in the collector adjacent to the base-collector junction. Another embodiment of the invention is a complementary insulated gate field effect transistor (IGFET) structure having N and P channel IGFETs with regions of implanted ions beneath the source and drain of one or both transistors, and/or annular regions projecting inwardly from the surface that surround or separate the different types of IG-FETs.

14 Claims, 5 Drawing Figures

CMOS
STRUCTURE

BIPOLAR
STRUCTURE

METHOD AND STRUCTURE FOR CONTROLLNG CARRIER LIFETIME IN SEMICONDUCTOR DEVICES

DESCRIPTION OF THE PRIOR ART

This invention relates to semiconductor devices and to methods of manufacturing same, and more particularly to a technique for controlling the minority carrier lifetime of the transistors both to improve the speed of operation or to reduce the gain.

When a bi-polar transistor is used in normal operation, the emitter base junction is forward biased and the collector-base junction is reverse biased. During operation, minority carriers are injected into the base from the emitter. These carriers are transported across the base and collected at the collector-base junction region. In transistor design, the base region is intentionally made very thin so there is a minimum recombination of the minority carriers in the base. Any recombination of minority carriers while traversing the base region reduces the collector current and increases the base current, thus reducing the device gain.

The bi-polar transistor is also used in switching circuits where it can operate in the saturation region. In this region of operation, the collector-base junction also becomes forward biased and minority carriers are injected into the collector from the base region. These carriers must be removed or recombined before the transistor will turn off. The speed of operation is therefore affected by the recombination rate in the collector. Thus, there is a need in the art to speed up the recombination of minority carriers in the collector to increase the speed of operation.

It is well known to diffuse a metal impurity such as gold into a semiconductor structure to control the lifetime. This is usually done to increase the recombination rate in the collector of bi-polar transistors operating in saturating switching circuits. However, the metals tend to diffuse in an uncontrolled fashion throughout the structure which causes detrimental effects to other properties of the device. For example, in a bi-polar transistor, the current gain is reduced and the junction leakage current increased with the introduction of gold. These effects are usually detrimental to transistor operation. However, there are occasions when it is desirable that the gain of a transistor be reduced, as for example in complementary field effect transistor applications wherein there are present parasitic transistors between the various elements. This is a very serious problem particularly when the size of the device is very small. The problem is discussed in detail in an article entitled "Beware of CMOS Switch Failure Modes" in Electronic 6, Mar. 15, 1975, Vol. 23, No. 6, p. 68. In this situation, a potential solution is to reduce the gain of the parasitic devices without significantly adversely affecting the operation and characteristics of the complementary devices. The parasitic transistor problem is inherent in the fabrication of complementary MOS integrated circuits on non-insulating substrates. The problem can be essentially eliminated by reducing the loop gain of the two transistors that make up the more commonly referred to "silicon controlled rectifier" (SCR) structure to less than one. If gold or other carrier lifetime reducing agents are introduced into the semiconductor body, the problem is reduced or eliminated, but at the expense of the operating characteristics of IGFET devices that make up the complementary circuitry.

Another solution is to provide dielectric insulated regions about each of the devices. However, this is expensive and quite difficult to implement using present technology.

Thus, there exists a present need for controlling the carrier lifetime in selected regions of semiconductor devices both for improving the operating characteristics of semiconductor devices as well as reducing the efficiency of parasitic transistors as they occur.

SUMMARY OF THE INVENTION

An object of this invention is to provide improved methods for carrier lifetime control in semi-conductor devices.

Another object of this invention is to provide semiconductor structure in which carrier lifetime control can be more efficiently accomplished.

Yet another object of this invention is to provide a new method for increasing the operating speed of a bi-polar transistor utilizing carrier lifetime reducing agents.

Still another object of this invention is to provide a semiconductor structure for reducing parasitic transistor action in semiconductor integrated circuit devices.

Another object of this invention is to provide a method for reducing parasitic transistor action in semiconductor integrated circuit devices.

Yet another invention of this invention is to provide a method for reducing parasitic transistor action in complementary IGFET applications.

Another object of this invention is to provide an integrated circuit complementary IGFET structure with no parasitic SCR action.

In accordance with the above objects, the invention is an integrated circuit semiconductor device having a controlled carrier lifetime means comprising a region of implanted inert atoms, said inert atoms selected from the group consisting of helium, neon, argon, xenon and krypton in the active region of the device. A preferred embodiment of the semiconductor structure of the invention is a bi-polar transistor having the implanted regions in the collector region. Another preferred embodiment of the invention is an integrated circuit complementary IGFET device structure having the implanted region in the base region of the parasitic transistors.

DESCRIPTION OF THE PREFERRED EMBODIMENTS

Figure 1:
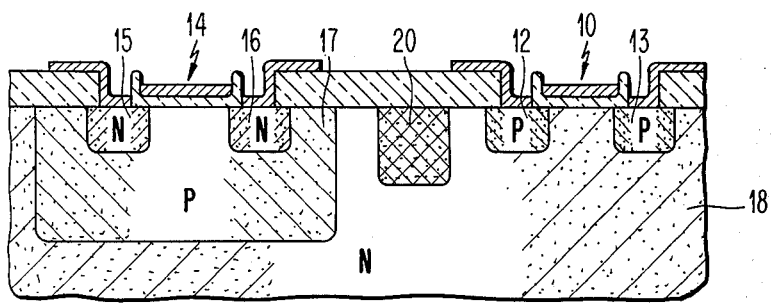
FIG. 1 is an elevational view in broken section illustrating a first embodiment of a complementary MOS structure of the invention.
Figure 2:
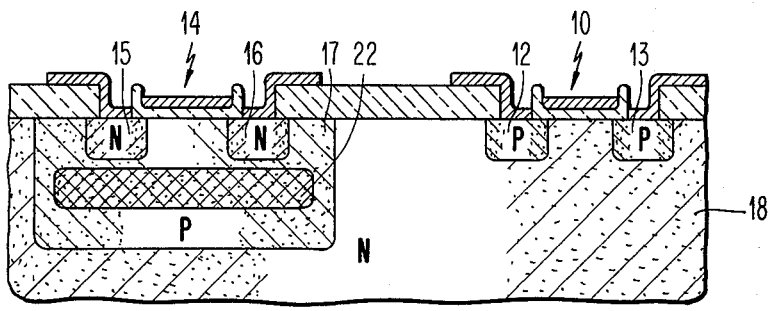
FIG. 2 is an elevational view in broken section illustrating another preferred embodiment of a CMOS structure of the invention.
Figure 3:
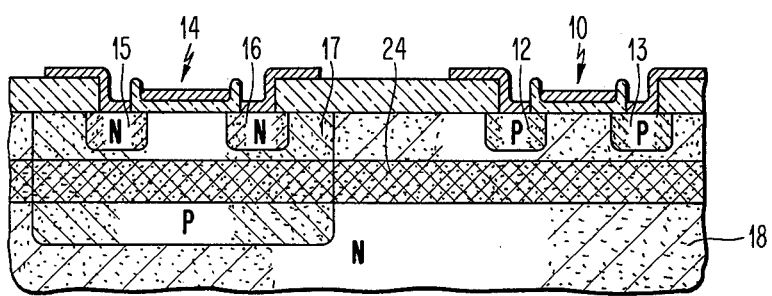
FIG. 3 is an elevational view in broken section illustrating yet another preferred specific embodiment of the CMOS structure of the invention.

The basic building blocks for all CMOS logic functions are N channel and P channel metal oxide semiconductor transistors as indicated in FIGS. 1–3. These devices function as voltage control switches and are capable of bi-lateral current flow between the source and drain. The heavily doped source and drain diffusions are separated by a narrow gap over which lies a thin gate insulator and aluminum or other conductor. In order for the transistors to conduct current from the source to drain, a voltage must be applied in excess of the threshold voltage from the gate to source. A threshold voltage is that voltage that must be exceeded in order to invert the silicon between the source and drain and form a conducting channel. Increasing the gate to source voltage beyond the threshold voltage further inverts the material under the gate electrode, increasing conductivity.

CMOS technology contains what is perhaps the most ideal set of operating characteristics for a logic family. The advantages are: (1) zero quiescent power, (2) high voltage noise immunity, (3) wide power supply range, and (4) high input impedance. Further, virtually any logic function can be performed using the parallel/series combinations of N and P channel transistors.

As disclosed in detail in the aforereferenced Electronics Design publication, integrated circuit CMOS logic and switching circuits, particularly highly microminiaturized devices, have inherent parasitic transistors that can give rise to latch up conditions in a wide number of cases. For example, in the N channel device illustrated in any of FIGS. 1, 2 or 3, there are inherent two types of transistors namely (1) a vertical NPN which results from either a source or drain acting as an emitter, the body acting as a base and the N-type substrate as a collector, and (2) a horizontal NPN transistor resulting from either a source or drain acting as an emitter, the P region surrounding the N channel device acting as a base, and the N substrate material acting as a collector. For the P channel device, a lateral PNP exists where the source or drain acts as an emitter, the N substrate as the base, and the P region surrounding the N channel devices as the collector.

Referring now to FIG. 1, there is shown a preferred specific embodiment of a CMOS structure wherein at least one aspect of the parasitic SCR problem is eliminated. The CMOS structure consists of a P channel IGFET 10 provided with a source 12 and drain region 13, an N channel IGFET 14 provided with a source 15 and drain 16 that are fabricated in a P region 17. Transistors 10 and 14 are formed in a monocrystalline substrate 18 embodying an N-type dopant. In accordance with our invention, a region 20 formed by implanting inert atoms, is located between transistors 14 and 10 outside region 17. Region 20 is formed by implanting inert atoms such as helium, neon, argon, xenon and krypton utilizing conventional ion implantation techniques.

We have discovered that inert atoms in a monocrystalline semiconductor body provide centers that facilitate the combining of minority and majority carriers. This, as is well known in transistor theory, effectively reduces the gain of a bi-polar transistor.

In FIG. 2, there is illustrated an implanted region 22 located in region 17 beneath the source and drain regions 15 and 16. Region 22 reduces the gain of the vertical transistor, i.e. N region 16, P region 17, and the N substrate 18. In FIG. 3, there is illustrated a continuous implanted region 24 formed by a blanket ion implant from the surface. Region 24 reduces the gain of the vertical parasitic transistors. It is understood that region 20 of FIG. 1 can be combined with either region 22 of FIG. 2 or region 24 of FIG. 3 in a single device to reduce the effectiveness of both vertical and horizontal parasitic transistors. Inert gas implants can be used to form recombination/generation centers in silicon wich can withstand severe high temperature processing. Thus, the regions 20, 22 and 24 can be formed in the body 18 at any stage in the fabrication process. The inert gas diffusion in silicon is very slow and therefore the effect is localized to the implanted area.

In general, the concentration of the inert atoms in regions 20, 22 and 24 is dependent on the nature of the geometry and doping levels in the various regions of the devices. The inert atom concentration is in the range of $10^{11}$ to $10^{16}$ atoms/cm$^2$, more particularly from $10^{14}$ to $10^{16}$ atoms/cm$^2$. It is apparent that the method of the invention is applicable to CMOS structures with N pockets as well as the P pockets that are illustrated in the drawings.

Figure 4:
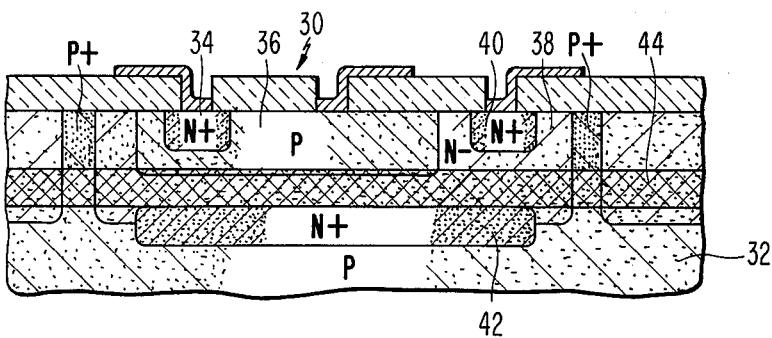
FIG. 4 is an elevational view in broken section illustrating an improved bi-polar transistor of the invention.
Figure 5:
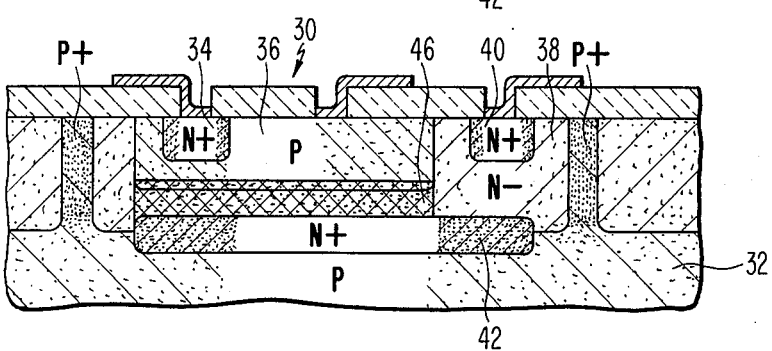
FIG. 5 is an elevational view in broken section illustrating another preferred specific embodiment of an improved bi-polar transistor of the invention.

Referring now to FIGS. 4 and 5, there is illustrated additional preferred specific embodiments of the structure and method of our invention. In FIG. 4, bi-polar transistor 30 is shown fabricated in body 32. Transistor 32 includes an emitter region 34, a base region 36 and a collector region 38 having a collector contact region 40 and a sub-collector 42. Transistor 32 is shown electrically isolated by a PN junction as is well known in the art. However, if desired, the isolation could alternately be dielectric isolation either complete dielectric isolation where a region of dielectric material completely surrounds the pocket containing the transistor 30, or a combination of dielectric isolation and junction isolation as described in U.S. Pat. No. 3,648,125. Region 44 of implanted inert atoms, similar to regions 20, 22 and 24 in FIGS. 1, 2 and 3 is provided in the collector region of the transistor. In FIG. 4, region 44 is a blanket type implant that extends over the entire area of the body 32. As indicated, region 44 does not substantially extend into the base region 36. In the embodiment shown in FIG. 4, the minority carrier control region 44 is provided to increase the speed of operation of the transistor 30 without materially reducing the gain of the device. This is in contrast to the embodiments shown in FIGS. 1, 2 and 3 where the gain of the parasitic transistor is deliberately reduced by regions 20, 22 and 24. Region 44 can be formed either before, during or after the various regions of the transistor 30 have been fabricated. As mentioned previously, the implanted region 44, unlike conventional carrier lifetime control agents, does not significantly diffuse throughout the device if heated and will not lose its lifetime control ability when the device is heated to heal the crystalline damage caused by its introduction.

Referring now to FIG. 5, there is illustrated a transistor 30 similar to that depicted in FIG. 4 except that the inert atom implant 46 is located only in the region of the collector beneath the base region 36. As in the embodiment shown in FIG. 5, the objective is to provide a region of inert implanted atoms that increase the speed of operation of the transistor device without significantly reducing the gain thereof.

The concentration of inert atoms in regions 44 and 46 is dependent on the nature of the transistor 30, i.e. the impurity concentration in the base and collector regions, and the physical geometry thereof. In general, the concentration of the inert atoms is in the range of $10^{11}$ to $10^{16}$ atoms/cm², more particularly in the range of $10^{14}$ to $10^{16}$ atoms/cm². The regions 44 and 46 can be introduced at any time during the fabrication of the device, as for example, after the various regions have been fabricated, before the regions have been fabricated, or during an intermediate stage. Further, the implantation can take place by interrupting the deposition of the epitaxial layer, implanting the inert atoms and subsequently continuing the epitaxial deposition. It is apparent that the method of the invention is also applicable to PNP type transistors.

EXAMPLE I

Bi-polar transistors were constructed to investigate the influence of inert gas implants on device characteristics. To simplify the processing, the transistors were made in a 0.5 ohm-cm N-type substrate rather than using a sub-collector diffusion and an epitaxial deposition. Thus, all devices have a common collector. An oxide layer was grown on the surface followed by the base making step and boron base diffusion. Oxide was grown over the base region followed by a silicon nitride deposition then pyrolytic oxide. The emitter masking was accomplished and openings were etched through the nitride layer leaving the 800 Angstroms of oxide in the emitter opening. To mask the implant, a 1.5 μm layer of resist was added and the emitters opened up on one-half of the wafer. Argon was implanted at an energy of 340 KeV and a dose of $10^{14}$ atoms/cm² for one wafer and $10^{15}$ atoms/cm² for another wafer. The implant was followed by an arsenic capsule diffusion for 80 minutes at 1000° C to form the emitter. The resulting structure had an emitter junction depth of 0.25 μm and a collector junction depth of 0.5 μm. The implant energy was chosen to place the peak of the implant in the vicinity of the base-emitter junction. The current gain (β) of the transistors was measured using a curve tracer with a 50 μA base drive. The results appear below.

| Wafer No. | Dose (cm$^{-2}$) | Implanted (β) | Non-Implanted (β) |
|---|---|---|---|
| 1 | $10^{14}$ | 26 | 29 |
| 2 | $10^{15}$ | .3 | 29 |

The results in the table indicate that inert gas implants can be used to form recombination/generation centers in silicon which can withstand high temperature processing as evidenced by the emitter diffusion. As the figures indicate, the implanting $10^{15}$ atoms/cm² of argon reduces the gain of the bi-polar transistors by two orders of magnitude. This indicates that the technique can be used to reduce the gain of parasitic transistors, and also indicates effectiveness of the recombination/generation centers for minority carrier lifetime to increase the speed of operation of a bipolar transistor when the inert atoms are located in the proper device regions.

EXAMPLE II

Six sets of monocrystalline silicon wafers having a <100> crystalline orientation, a P-type impurity background doping, and a resistivity of 2 ohm-cm with a 500 Angstrom thick thermal oxide were selected. Five of the sets of wafers were subjected to argon bombardment wherein argon was implanted at an energy of 200 KeV at dosages of $10^{11}$, $10^{12}$, $10^{13}$, $10^{14}$ and $10^{16}$ atoms/cm², respectively. The sixth set of wafers was control set, since no bombardment was made. After the ion implant operation, the wafers were all annealed at 1050° C for 30 minutes. The minority carrier lifetime was then measured by pulse MOS techniques. In this operation, an MOS capacitor is biased into inversion and a further depleting pulse is applied. This causes the depletion region to widen to a point where the number of ionized impurity sites includes and equals the charges induced by the voltage change. The depletion region then decays back to its equilibrium width in a time determined by the minority carrier generation rate. For small applied voltage steps, the minority carrier lifetime is given by $$t = \frac{T}{2} \frac{n_i}{N_d}$$

where T is the time taken for the capacitance to return to its equilibrium value, $n_i$ is the intrinsic carrier concentration and $N_d$ is the dopant concentration in the silicon. The pulse MOS technique provides a very convenient method of measuring lifetimes as the transient measured experimentally may be $10^5$ to $10^6$ times as long as the lifetime with the magnification factor being determined by Nd/ni. Measurements were made using a 1 MH$_z$ capacitance meter. The following table depicts the results:

| Run No. | Dose (cm$^{-2}$) | Lifetime (nsec) |
|---|---|---|
| 1 | $10^{11}$ | 10 |
| 2 | $10^{12}$ | 4 |
| 3 | $10^{13}$ | 1 |
| 4 | $10^{14}$ | .4 |
| 5 | $10^{16}$ | .0002 |
| 6 | 0 | 10,000 |

The above results indicate a pronounced reduction in the minority carrier lifetime as the dosage of the implanted argon is increased.

EXAMPLE III

The same procedure as in EXAMPLE II was followed on four sets of monocrystalline silicon wafers having a <100> crystalline orientation but having an N-type dopant background and a resistivity of 10 ohm-cm. The minority carrier lifetime was measured initially before the implant and determined to be 10μsec.

| Run No. | Dose (cm$^{-2}$) | Lifetime (nsec) |
|---|---|---|
| 1 | $10^{11}$ | 800 |
| 2 | $10^{12}$ | 300 |
| 3 | $10^{13}$ | 100 |
| 4 | $10^{14}$ | 3 |

As the above results indicate, with an N-type background doping, the minority carrier lifetime decreases significantly with an increase in the dosage of argon implant atoms.

EXAMPLE IV

The same basic procedure was followed as outlined in Example II wherein three sets of 10 ohm-cm monocrystalline silicon wafers having an N-type background were implanted with xenon and subsequently annealed at 1050° C for 30 minutes. The following results were obtained:

| Run No. | Dose (cm$^{-2}$) | Lifetime (nsec) |
|---|---|---|
| 1 | 10$^{13}$ | 500 |
| 2 | 10$^{14}$ | 150 |
| 3 | 3 × 10$^{14}$ | .8 |

EXAMPLE V

Three sets of monocrystalline silicon wafers were selected. Similar blanket implants of argon were made to all of the wafers in each of the respective sets wherein argon was implanted at an energy of 200 KeV at a dosage of 10$^{15}$ atoms/cm$^2$. The first set was not annealed, the second set annealed at 1050° C for 30 minutes and the third set at 1150° C for 30 minutes.

In order to determine the proportion of the remaining dosage of the implanted argon atoms that remain after the anneals, the wafers were bombarded by helium atoms at 2 MeV and the back-scattering measured. A spectrum was obtained from the argon implanted wafers for the various anneal temperatures. The spectrum indicated that the proportion remaining after the original dose was found to be 60 percent for the wafers annealed at 1050° C and 55 percent for the wafers annealed at 1150° C as compared to the unannealed set. This indicates that the inert atoms introduced into a wafer which is subsequently heated remain substantially in the original region without migrating about within the wafer.

While the invention has been particulaly shown and described with reference to the preferred embodiments thereof, it will be understood by those skilled in the art that the foregoing and other changes in form and detail may be made therein without departing from the spirit and scope of the invention.

What is claimed is:

1. An integrated semiconductor device in a semiconductor substrate of monocrystalline semiconductor material of a first type conductivity, regions of a second opposite type conductivity, complementary field effect transistors in the substrate and in the regions, the improvement comprising at least one region of implanted inert atoms within the device, said inert atoms selected from the group consisting of argon, krypton and xenon that reduce the gain of parasitic transistor action by reducing the minority carrier lifetime, said implanted inert atoms in said region forming substantially immobile recombination centers, said region subjected to a high temperature anneal that substantially recrystallizes any lattice damage resulting from the implantation step, the concentration of said implanted inert atoms being substantially greater than the density of any remaining lattice damage sites.

2. The device of claim 1 wherein said inert atoms are argon introduced by ion implantation.

3. The device of claim 1 wherein said region is a blanket implant region located beneath and spaced from the source and drain regions.

4. The device of claim 1 wherein said region is a plurality of planar regions in said regions of opposite conductivity located beneath and spaced from the source and drain regions.

5. The device of claim 1 wherein said region is a plurality of annular regions separating said transistors.

6. The device of claim 3 wherein said region further includes regions of inert atoms that provide lateral separation of the transistors.

7. The device of claim 1 wherein the concentration of inert atoms is in the range of 10$^{14}$ to 10$^{16}$ atoms/cm$^2$.

8. The device of claim 1 wherein said first type conductivity is N, and said opposite type conductivity is P, the transistors in said regions of opposite conductivity are N-channel, and the transistors in said substrate are P-channel.

9. An integrated circuit semiconductor device in a substrate of a monocrystalline semiconductor material having a plurality of transistor elements, each provided with a collector region, a base region having a flat junction that is parallel to the top surface, and an emitter region, the improvement comprising a region of implanted inert atoms within said device in at least the collector region having a significant concentration of atoms selected from the group consisting of argon, krypton and xenon, said region of implanted inert atoms in operation reducing the minority carrier lifetime, said implanted inert atoms in said region for forming substantially immobile recombination centers, said region subjected to a high temperature anneal that substantially recyrstallizes any lattice damage resulting from the implantation step, the concentration of said implanted inert atoms being substantially greater than the density of any remaining lattice damage sites.

10. The device of claim 9 wherein said implanted region is a blanket implant region.

11. The device of claim 9 wherein said implanted region substantially underlies only the base region of the transistor.

12. The device of claim 9 wherein said inert atom is argon.

13. The device of claim 12 wherein the concentration of inert atoms in said implanted region is in the range of 10$^{14}$ to 10$^{16}$ atoms/cm$^2$.

14. The device of claim 9 wherein said implanted region extends to the collector base junction.

* * * * *